(12) United States Patent
Kobayashi

(10) Patent No.: US 9,832,406 B2
(45) Date of Patent: Nov. 28, 2017

(54) SOLID-STATE IMAGING DEVICE AND IMAGING APPARATUS

(71) Applicant: OLYMPUS CORPORATION, Hachioji-shi, Tokyo (JP)

(72) Inventor: Kenji Kobayashi, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/201,927

(22) Filed: Jul. 5, 2016

(65) Prior Publication Data

US 2016/0316162 A1 Oct. 27, 2016

Related U.S. Application Data

(63) Continuation of application No. PCT/JP2015/050606, filed on Jan. 13, 2015.

(30) Foreign Application Priority Data

Jan. 24, 2014 (JP) .................................. 2014-011618

(51) Int. Cl.
*H04N 3/14* (2006.01)
*H04N 5/335* (2011.01)
(Continued)

(52) U.S. Cl.
CPC ....... *H04N 5/374* (2013.01); *H01L 27/14634* (2013.01); *H01L 27/14636* (2013.01); *H04N 5/378* (2013.01)

(58) Field of Classification Search
CPC .. H04N 5/374; H04N 5/378; H01L 27/14634; H01L 27/14636; H01L 23/535;
(Continued)

(56) References Cited

U.S. PATENT DOCUMENTS 5,070,236 A * 12/1991 Miyake .............. H04N 1/40056
250/208.1
2015/0054110 A1 * 2/2015 Kashihara ......... H01L 27/14636
257/435

FOREIGN PATENT DOCUMENTS

EP 1 037 095 A2 9/2000
EP 2 466 999 A1 6/2012
(Continued)

OTHER PUBLICATIONS

International Search Report dated Mar. 10, 2015, issued in counterpart International Application No. PCT/JP2015/050606 (2 pages).

*Primary Examiner* — Yogesh Aggarwal
(74) *Attorney, Agent, or Firm* — Westerman, Hattori, Daniels & Adrian, LLP

(57) ABSTRACT

A solid-state imaging device, in which a plurality of overlapping substrates are included and the plurality of substrates are electrically connected to each other, includes a pixel circuit, a first readout circuit configured to read out signals from the photoelectric conversion units, a signal-processing circuit configured to perform signal processing on signals read out from the photoelectric conversion units, an output circuit configured to output signals processed by the signal-processing circuit to the outside, a first wiring configured to be provided to correspond to each of the four circuits and to supply a first voltage to each of the four circuits, a second wiring configured to be provided to correspond to each of the four circuits and to supply a second voltage different from the first voltage to each of the circuits, and a capacitor that is electrically connected with the first wiring and the second wiring.

13 Claims, 11 Drawing Sheets

(51) Int. Cl.
*H04N 5/374* (2011.01)
*H01L 27/146* (2006.01)
*H04N 5/378* (2011.01)

(58) Field of Classification Search
CPC .............. H01L 23/538; H01L 23/5381; H01L 23/5383; H01L 27/1464; H01L 27/14643; H01L 27/14661
USPC .................................................. 348/294–324
See application file for complete search history.

(56) References Cited

FOREIGN PATENT DOCUMENTS

| | | |
|---|---|---|
| JP | 2000-323698 A | 11/2000 |
| JP | 2001-203300 A | 7/2001 |
| JP | 2001-274420 A | 10/2001 |
| JP | 2009-177207 A | 8/2009 |
| JP | 2012-129443 A | 7/2012 |

* cited by examiner

SOLID-STATE IMAGING DEVICE AND IMAGING APPARATUS

This application is a continuation application based on a PCT International Application No. PCT/JP2015/050606, filed on Jan. 13, 2015, whose priority is claimed on Japanese Patent Application No. 2014-011618, filed on Jan. 24, 2014 in Japan. The contents of the PCT International Application and the Japanese Patent Application are incorporated herein by reference.

BACKGROUND OF THE INVENTION

Field of the Invention

The present invention relates to a solid-state imaging device in which photoelectric conversion units are arranged in a matrix, and an imaging apparatus having the solid-state imaging device.

Description of Related Art

In order to miniaturize the solid-state imaging device (imager), a solid-state imaging device in which a plurality of substrates overlap each other (are laminated) and the substrates are electrically connected to each other is known (for example, refer to Japanese Unexamined Patent Application, First Publication No. 2009-177207). Due to demands for miniaturization of electrical apparatuses in recent years, further miniaturization of solid-state imaging devices has been required.

In order to realize further miniaturization of solid-state imaging devices, it is necessary to narrow the width of a power-source line that supplies a power-source voltage or the width of a reference voltage line that supplies a reference voltage (a ground voltage). If the width of the power-source line or the reference voltage line is narrowed, impedance of wiring increases and thus noise becomes greater.

SUMMARY OF THE INVENTION

According to a first aspect of the present invention, a solid-state imaging device in which a plurality of overlapping substrates are included and the plurality of substrates are electrically connected to each other by a connection unit is provided with a pixel circuit in which photoelectric conversion units that convert incident light into signals are arranged in a matrix, a first readout circuit that read outs signals from the photoelectric conversion units, a signal-processing circuit that performs signal processing on signals read out from the photoelectric conversion units, an output circuit that outputs signals processed by the signal-processing circuit to the outside, a first wiring that is provided to correspond to each of the four circuits that are the pixel circuit, the first readout circuit, the signal-processing circuit, and the output circuit and supplies a first voltage to each of the four circuits, a second wiring that is provided to correspond to each of the four circuits and supplies a second voltage that is different from the first voltage to each of the four circuits, and a capacitor that is electrically connected with the first wiring and the second wiring corresponding to at least one of the four circuits, the first terminal of which is electrically connected with the first wiring and the second terminal of which is electrically connected with the second wiring. The capacitor is arranged in a region facing a corresponding circuit in a substrate that is different from another substrate on which the corresponding circuit among the four circuits is arranged.

According to a second aspect of the present invention, in the solid-state imaging device according to the first aspect, the capacitor may be electrically connected with the first wiring and the second wiring via the connection unit.

According to a third aspect of the present invention, in the solid-state imaging device according to the first aspect, the first wiring and the second wiring may be arranged across the substrate on which the corresponding circuit among the four circuits is arranged and a substrate adjacent to the substrate, and the capacitor may be electrically connected with the first wiring and the second wiring on the adjacent substrate.

According to a fourth aspect of the present invention, in the solid-state imaging device according to the first aspect, the capacitor may have a first capacitor that is electrically connected with the first wiring and the second wiring corresponding to the first readout circuit and a second capacitor that is electrically connected with the first wiring and the second wiring corresponding to the signal-processing circuit or the output circuit, and a capacitance value of the first capacitor may be higher than a capacitance value of the second capacitor.

According to a fifth aspect of the present invention, in the solid-state imaging device according to the first aspect, the capacitor may have a first capacitor that is electrically connected with the first wiring and the second wiring corresponding to the first readout circuit, a second capacitor that is electrically connected with the first wiring and the second wiring corresponding to the signal-processing circuit, and a third capacitor that is electrically connected with the first wiring and the second wiring corresponding to the output circuit, and a capacitance value of the first capacitor may be higher than a capacitance value of the second capacitor and a capacitance value of the third capacitor.

According to a sixth aspect of the present invention, in the solid-state imaging device according to the first aspect, a memory that retains signals read out from the photoelectric conversion units, a second readout circuit that reads out signals retained in the memory unit and causes the read out signals to be input to the signal-processing circuit, a third wiring that supplies the first voltage to the second readout circuit, a fourth wiring that supplies the second voltage to the second readout circuit, and a second readout circuit capacitor, the first terminal of which is connected with the third wiring and the second terminal of which is connected with the fourth wiring may be provided.

According to a seventh aspect of the present invention, in the solid-state imaging device according to the first aspect, the first readout circuit may have a first row readout circuit that reads out signals from the photoelectric conversion units of a first row, and a second row readout circuit that reads out signals from the photoelectric conversion units of a second row that is different from the first row, the first wiring and the second wiring may be provided to correspond respectively to the first row readout circuit and the second row readout circuit, and the capacitor may have a first capacitor that is electrically connected with the first wiring and the second wiring corresponding to the first row readout circuit, the first terminal of which is electrically connected with the first wiring and the second terminal of which is electrically connected with the second wiring, and a second capacitor that is electrically connected with the first wiring and the second wiring corresponding to the second row readout circuit, the first terminal of which is electrically connected with the first wiring and the second terminal of which is electrically connected with the second wiring.

According to an eighth aspect of the present invention, in the solid-state imaging device according to the first aspect, the signal-processing circuit may have a first column signal-processing circuit that performs signal processing on signals read out from the photoelectric conversion units of a first column and a second column signal-processing circuit that performs signal processing on signals read out from the photoelectric conversion units of a second column that is different from the first column, the first wiring and the second wiring may be provided to correspond to each of the first column signal-processing circuit and the second column signal-processing circuit, and the capacitor may have a first capacitor that is electrically connected with the first wiring and the second wiring corresponding to the first column signal-processing circuit, the first terminal of which is electrically connected with the first wiring and the second terminal of which is electrically connected with the second wiring, and a second capacitor that is electrically connected with the first wiring and the second wiring corresponding to the second column signal-processing circuit, the first terminal of which is electrically connected with the first wiring and the second terminal of which is electrically connected with the second wiring.

According to a ninth aspect of the present invention, in the solid-state imaging device according to the seventh aspect, a capacitance value of the first capacitor and a capacitance value of the second capacitor may be capacitance values according to a distance from a voltage source supplying the first voltage.

According to a tenth aspect of the present invention, in the solid-state imaging device according to the eighth aspect, a capacitance value of the first capacitor and a capacitance value of the second capacitor may be capacitance values according to a distance from a voltage source supplying the first voltage.

According to an eleventh aspect of the present invention, in the solid-state imaging device according to the seventh aspect, a capacitance value of the first capacitor and a capacitance value of the second capacitor may be capacitance values according to a distance from a voltage source supplying the second voltage.

According to a twelfth aspect of the present invention, in the solid-state imaging device according to the eighth aspect, a capacitance value of the first capacitor and a capacitance value of the second capacitor may be capacitance values according to a distance from a voltage source supplying the second voltage.

According to a thirteenth aspect of the present invention, an imaging apparatus is an imaging apparatus provided with the solid-state imaging device according to the first aspect.

DETAILED DESCRIPTION OF THE INVENTION

Embodiments of the present invention will be described below with reference to the drawings.

First Embodiment

Figure 1:
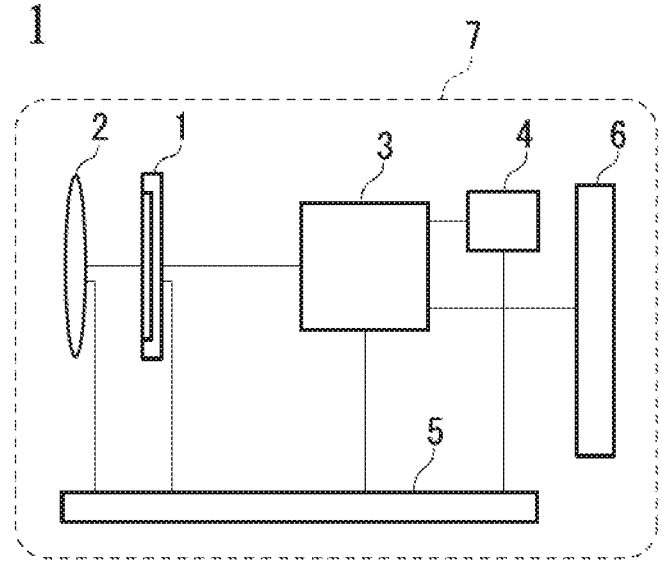
FIG. 1 is a block diagram showing a constitution example of a digital camera according to a first embodiment of the present invention.

First, the first embodiment of the present invention will be described. FIG. 1 shows a constitution example of a digital camera that is an example of an imaging apparatus according to the present embodiment. As shown in FIG. 1, the digital camera 7 has a solid-state imaging device 1, a lens unit 2, an image-processing device 3, a recording device 4, a camera control device 5, and a display device 6.

The lens unit 2 has an optical system including lenses, etc., and causes a subject image formed with light from a subject to be formed in the solid-state imaging device 1. Driving operations for zooming, focusing, aperture, and the like of the lens unit 2 are controlled by the camera control device 5. The solid-state imaging device 1 is an MOS imaging device that converts light of a subject incident on the digital camera 7 via the lens unit 2 into an image signal. Driving operations of the solid-state imaging device 1 are controlled by the camera control device 5. Details of this solid-state imaging device 1 will be described below.

The image-processing device 3 performs processing such as signal amplification and conversion into image data on an image signal output from the solid-state imaging device 1, and performs processing such as various types of correction and compression on the converted image data. The recording device 4 is a detachable recording medium such as a semiconductor memory, and performs recording and readout of image data. The display device 6 is a display device such as liquid crystal displaying image data based on an image signal output from the solid-state imaging device 1 or images based on image data read out from the recording device 4.

Figure 2:
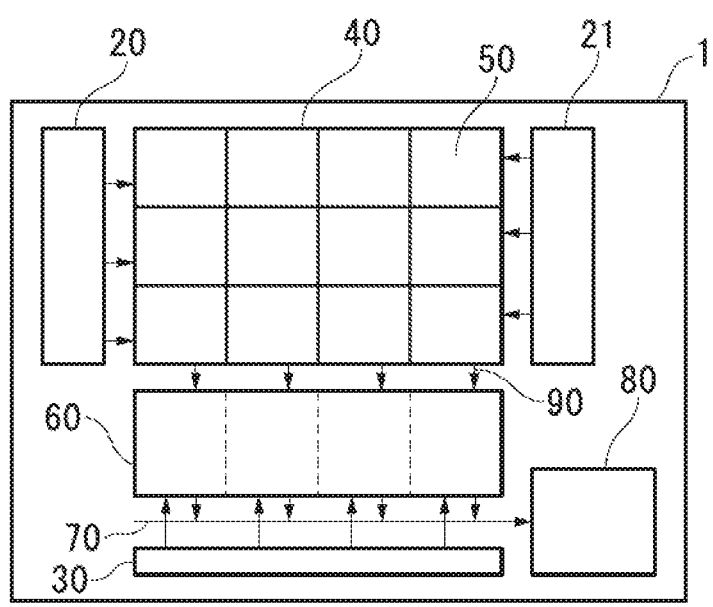
FIG. 2 is a block diagram showing a constitution example of a solid-state imaging device according to the first embodiment of the present invention.

FIG. 2 shows a constitution example of the solid-state imaging device 1. As shown in FIG. 2, the solid-state imaging device 1 has a first readout unit 20, a second readout unit 21, a horizontal readout unit 30, a pixel unit 40, a signal-processing unit 60, and an output unit 80.

The pixel unit 40 has a plurality of pixels 50. The pixels 50 include respective photoelectric conversion units that convert incident light into signals and memory units that retain signals read out from the photoelectric conversion units. Although the plurality of pixels 50 are arranged in FIG. 2, one representative pixel 50 is shown with a reference numeral. The plurality of pixels 50 are arranged in a matrix. Each of the pixels 50 is connected to vertical signal lines 90 to output signals generated by the photoelectric conversion units to the vertical signal lines 90. The plurality of vertical signal lines 90 are arranged, and each of the vertical signal lines 90 is arranged for each column of the array of the pixels 50.

The first readout unit 20 reads out signals from the photoelectric conversion units that are inside the plurality of pixels 50. To be more specific, the first readout unit 20 outputs a control signal to each row of the array of the pixels 50. This control signal is a signal for controlling readout of signals from the photoelectric conversion units that are inside the plurality of pixels 50. Due to the control signal, signals from the photoelectric conversion units inside the plurality of pixels 50 arranged in the same row of the array of the pixels 50 are simultaneously read out. The signals read out from the photoelectric conversion units inside the plurality of pixels 50 are retained in the memory units of the plurality of pixels 50.

The second readout unit 21 reads out signals retained in the memory units inside the plurality of pixels 50 that are read out from the photoelectric conversion units that are inside the plurality of pixels 50. The second readout unit 21 causes the read out signals to be input into the signal-processing unit 60. To be more specific, the second readout unit 21 outputs a control signal to each row of the array of the pixels 50. This control signal is a signal for controlling readout of signals from the memory units that are inside the plurality of pixels 50. Due to the control signal, signals from the memory units inside the plurality of pixels 50 arranged in the same row of the array of the pixels 50 are simultaneously read out. The signals read out from the memory units inside the plurality of pixels 50 are output to the vertical signal lines 90.

The signal-processing unit 60 performs signal processing on signals from the plurality of pixels 50. To be more specific, the signal-processing unit 60 has a plurality of column signal-processing units. The column signal-processing units are arranged for each column of the array of the pixels 50, and are connected to the vertical signal lines 90 of each column. The column signal-processing units perform noise suppression, etc., using correlated double sampling (CDS) on the signals output from the pixels 50 of each column to the vertical signal lines 90.

The horizontal readout unit 30 reads out signals processed by the signal-processing unit 60 to the horizontal signal line 70. To be more specific, the horizontal readout unit 30 sequentially reads out signals output from each of the plurality of column signal-processing units that are inside the signal-processing unit 60 to the horizontal signal line 70.

The output unit 80 outputs signals processed by the signal-processing unit 60 to the outside. To be more specific, the output unit 80 appropriately performs processing such as an amplification process on the signals processed by the signal-processing unit 60 and read out to the horizontal signal line 70. The output unit 80 outputs the processed signals to the outside.

Figure 3:
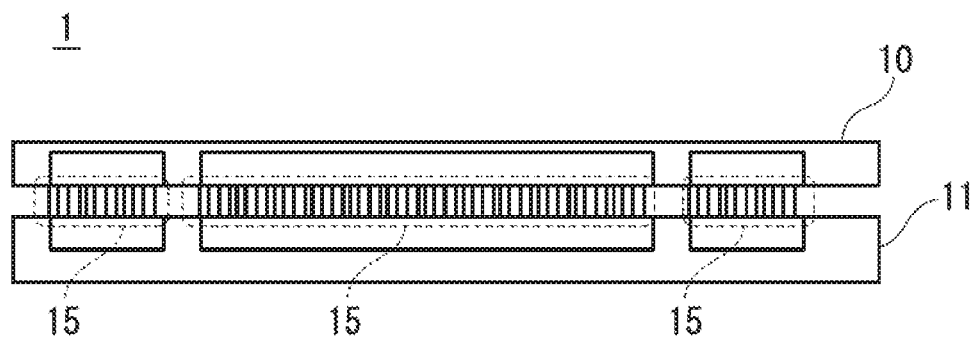
FIG. 3 is a cross-sectional view showing a structural example of the solid-state imaging device according to the first embodiment of the present invention.

FIG. 3 shows a structural example of the solid-state imaging device 1. In FIG. 3, a cross section of the solid-state imaging device 1 is shown. The solid-state imaging device 1 has a first substrate 10, a second substrate 11, and connection units 15 as shown in FIG. 3.

The first substrate 10 and the second substrate 11 overlap each other in a state in which their principal faces (the widest faces among the plurality of faces constituting the surfaces of the substrates) face each other. The connection units 15 are arranged between the first substrate 10 and the second substrate 11. The connection units 15 are each constituted by a bump, a through-electrode, etc., and electrically connected with the first substrate 10 and the second substrate 11. The connection units 15 may be constituted by a first electrode formed on the first substrate 10 and a second electrode that is formed on the second substrate 11 and connected with the first electrode without having bumps interposed therebetween.

In the present embodiment, an example of the solid-state imaging device having the two substrates will be described. The technology described in the present embodiment can be applied to a solid-state imaging device in which a plurality of overlapping substrates are provided and the plurality of substrates are electrically connected to each other by a connection unit.

Figure 4:
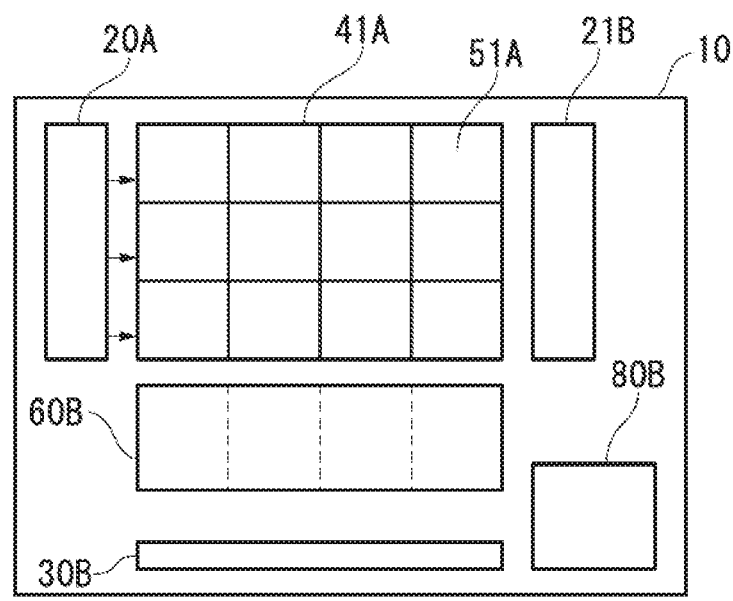
FIG. 4 is a block diagram showing a constitution example of a first substrate constituting the solid-state imaging device according to the first embodiment of the present invention.

FIG. 4 shows a constitution example of the first substrate 10. As shown in FIG. 4, the first substrate 10 has a first readout circuit 20A, a second readout circuit capacitor unit 21B, a horizontal readout circuit capacitor unit 30B, a pixel circuit 41A, a signal-processing circuit capacitor unit 60B, and an output circuit capacitor unit 80B.

The pixel circuit 41A is a circuit which is arranged on the first substrate 10 among circuits constituting the pixel unit 40. The pixel circuit 41A has a plurality of photoelectric conversion units 51A that convert incident light into signals. Although the plurality of photoelectric conversion units 51A are arranged in FIG. 4, one representative photoelectric conversion unit 51A is shown with a reference numeral. The plurality of photoelectric conversion units 51A are arranged in a matrix.

The first readout circuit 20A is a circuit which is arranged on the first substrate 10 among circuits constituting the first readout unit 20. The first readout circuit 20A reads out signals from the plurality of photoelectric conversion units 51A. To be more specific, the first readout circuit 20A outputs a control signal to each row of the array of the photoelectric conversion units 51A. This control signal is a signal for controlling readout of signals from the plurality of photoelectric conversion units 51A. Due to the control signal, the signals from the photoelectric conversion units 51A arranged in the same row of the array of the photoelectric conversion units 51A are simultaneously read out. The signals read out from the photoelectric conversion units 51A are transferred to the second substrate 11 via the connection units 15.

The second readout circuit capacitor unit 21B is a circuit arranged on the first substrate 10 among circuits constituting the second readout unit 21. The horizontal readout circuit capacitor unit 30B is a circuit arranged on the first substrate 10 among circuits constituting the horizontal readout unit 30. The signal-processing circuit capacitor unit 60B is a circuit arranged on the first substrate 10 among circuits constituting the signal-processing unit 60. The output circuit capacitor unit 80B is a circuit arranged on the first substrate 10 among circuits constituting the output unit 80. The second readout circuit capacitor unit 21B, the horizontal readout circuit capacitor unit 30B, the signal-processing circuit capacitor unit 60B, and the output circuit capacitor unit 80B will be described below.

Figure 5:
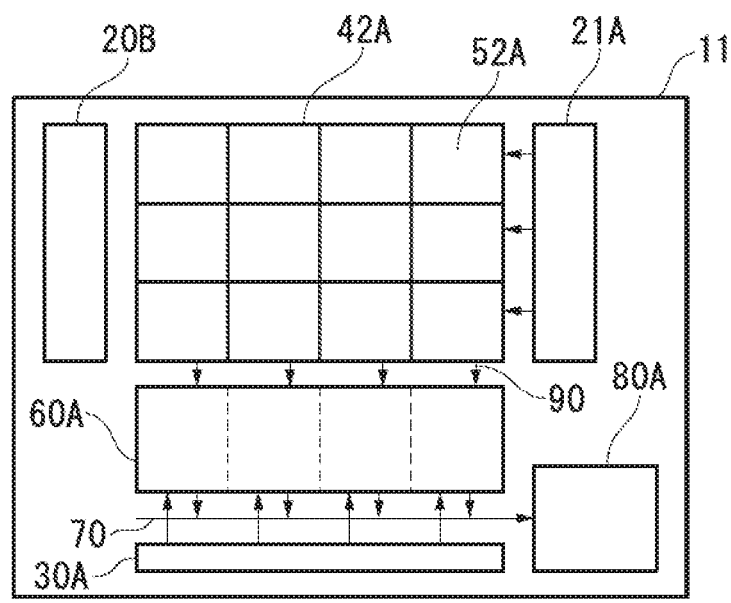
FIG. 5 is a block diagram showing a constitution example of a second substrate constituting the solid-state imaging device according to the first embodiment of the present invention.

FIG. 5 shows a constitution example of the second substrate 11. As shown in FIG. 5, the second substrate 11 has a first readout circuit capacitor unit 20B, a second readout circuit 21A, a horizontal readout circuit 30A, a memory circuit 42A, a signal-processing circuit 60A, and an output circuit 80A.

The memory circuit 42A is a circuit arranged on the second substrate 11 among the circuits constituting the pixel unit 40. The region of the first substrate 10 in which the pixel circuit 41A is arranged and the region of the second substrate 11 in which the memory circuit 42A is arranged are regions facing each other. The memory circuit 42A has a plurality of memory units 52A. The memory units 52A retain signals read out from the photoelectric conversion units 51A and transferred to the second substrate 11. Although the plurality of memory units 52A are arranged in FIG. 5, one representative memory unit 52A is shown with a reference numeral. The plurality of memory units 52A are arranged in a matrix.

The second readout circuit 21A is a circuit arranged on the second substrate 11 among the circuits constituting the first readout unit 20. The second readout circuit capacitor unit 21B arranged on the first substrate 10 and the second readout circuit 21A arranged on the second substrate 11 are arranged to face each other. The second readout circuit 21A reads out signals retained in the plurality of memory units 52A and causes the read out signals to be input to the signal-processing circuit 60A. To be more specific, the second readout circuit 21A outputs a control signal to each row of the array of the memory units 52A. This control signal is a signal for controlling readout of signals from the plurality of memory units 52A. Due to this control signal, signals from the memory units 52A arranged in the same row of the array of the memory unit 52A are simultaneously read out. The signals read out from the plurality of memory units 52A are output to the vertical signal lines 90.

The signal-processing circuit 60A is a circuit arranged on the second substrate 11 among the circuits constituting the signal-processing unit 60. The signal-processing circuit capacitor unit 60B arranged on the first substrate 10 and the signal-processing circuit 60A arranged on the second substrate 11 are arranged to face each other. The signal-processing circuit 60A performs signal processing on the signals read out from the plurality of memory units 52A. To be more specific, the signal-processing circuit 60A has a plurality of column signal-processing circuits. The column signal-processing circuits are arranged for each column of the array of the memory unit 52A and connected to the vertical signal lines 90 of each column. The column signal-processing circuits perform processing such as noise suppression using CDS on the signals output from the memory units 52A of each column to the vertical signal lines 90.

The horizontal readout circuit 30A is a circuit arranged on the second substrate 11 among the circuits constituting the horizontal readout unit 30. The horizontal readout circuit capacitor unit 30B arranged on the first substrate 10 and the horizontal readout circuit 30A arranged on the second substrate 11 are arranged to face each other. The horizontal readout circuit 30A reads out signals processed by the signal-processing circuit 60A to the horizontal signal line 70. To be more specific, the horizontal readout circuit 30A sequentially reads out the signals output from each of the plurality of column signal-processing circuits inside the signal-processing circuit 60A to the horizontal signal line 70.

The output circuit 80A is a circuit arranged on the second substrate 11 among the circuits constituting the output unit 80. The output circuit capacitor unit 80B arranged on the first substrate 10 and the output circuit 80A arranged on the second substrate 11 are arranged to face each other. The output circuit 80A outputs signals processed by the signal-processing circuit 60A to the outside. To be more specific, the output circuit 80A appropriately performs processing such as an amplification process on the signals processed by the signal-processing circuit 60A and read out to the horizontal signal line 70, and outputs the processed signals to the outside.

Figure 6:
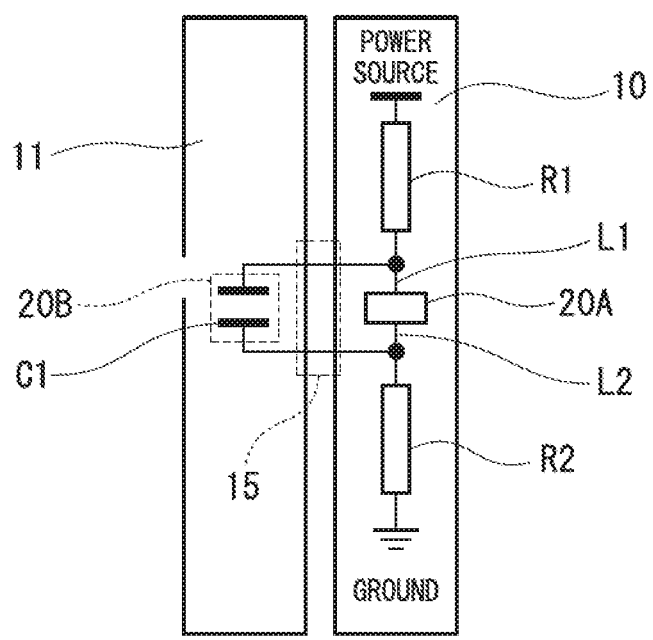
FIG. 6 is a circuit diagram showing a peripheral constitution example of a first readout circuit and a first readout circuit capacitor unit included in the solid-state imaging device according to the first embodiment of the present invention.

FIG. 6 shows a peripheral constitution example of the first readout circuit 20A and the first readout circuit capacitor unit 20B. First wiring L1 and second wiring L2 are provided to correspond to the first readout circuit 20A. The first readout circuit 20A is connected with the first wiring L1 and the second wiring L2.

The first wiring L1 is connected with a power source. The first wiring L1 supplies a power-source voltage that is a first voltage to the first readout circuit 20A. There is first impedance R1 caused by resistance or inductance on the first wiring L1.

The second wiring L2 is connected with a ground. The second wiring L2 supplies a ground voltage (reference voltage) that is a second voltage different from the first voltage to the first readout circuit 20A. There is second impedance R2 caused by resistance or inductance on the second wiring L2. The first voltage may be a ground voltage, and the second voltage may be a power-source voltage, or the like.

The first readout circuit capacitor unit 20B has a capacitor C1 functioning as a so-called bypass capacitor. The capacitor C1 is arranged in a region facing the first readout circuit 20A in the second substrate 11 that is different from the first substrate 10 on which the first readout circuit 20A is arranged (the second substrate 11 adjacent to the first substrate 10). The first terminal of the capacitor C1 is electrically connected with the first wiring L1 via the connection units 15. The second terminal of the capacitor C1 is electrically connected with the second wiring L2 via the connection units 15. That is, the capacitor C1 is electrically connected with the first wiring L1 and the second wiring L2 via the connection units 15.

By providing the capacitor C1, it is possible to suppress a current momentarily flowing through the first wiring L1 and the second wiring L2 (a momentarily changing current) during driving of the first readout circuit 20A. By suppressing the current momentarily flowing through the first wiring L1 and the second wiring L2, a voltage drop caused by the first impedance R1 and the second impedance R2 can be reduced. Thereby, noise of an analog signal supplied to the first readout circuit 20A can be reduced and an erroneous operation of the first readout circuit 20A can be prevented.

The first substrate 10 does not need a region in which the capacitor C1 is arranged. By arranging the capacitor C1 in a region of the second substrate 11 facing the first readout circuit 20A, the first readout circuit 20A and the capacitor C1 are arranged to be very close to each other. By arranging the first readout circuit 20A and the capacitor C1 to be close to each other, a voltage drop caused by resistance, inductance, or the like of wiring between the first readout circuit 20A and the capacitor C1 is reduced. Thus, noise of an analog signal supplied to the first readout circuit 20A can be further reduced.

A peripheral constitution of the second readout circuit capacitor unit 21B and the second readout circuit 21A is the same as the constitution shown in FIG. 6. That is, first wiring (third wiring) and second wiring (fourth wiring) are provided to correspond to the second readout circuit 21A, and the second readout circuit 21A is connected with the first wiring and the second wiring. The first wiring supplies a first voltage to the second readout circuit 21A. The second wiring supplies a second voltage that is different from the first voltage to the second readout circuit 21A.

The second readout circuit capacitor unit 21B has a capacitor (readout circuit capacitor). The capacitor is arranged in a region facing the second readout circuit 21A in the first substrate 10 that is different from the second substrate 11 on which the second readout circuit 21A is arranged (the first substrate 10 adjacent to the second substrate 11). The first terminal of the capacitor is electrically connected with the first wiring via the connection units 15. The second terminal of the capacitor is electrically connected with the second wiring via the connection units 15. That is, the capacitor is electrically connected with the first wiring and the second wiring via the connection units 15.

A peripheral constitution of the horizontal readout circuit capacitor unit 30B and the horizontal readout circuit 30A is the same as the constitution shown in FIG. 6. That is, first wiring and second wiring are provided to correspond to the horizontal readout circuit 30A, and the horizontal readout circuit 30A is connected with the first wiring and the second wiring. The first wiring supplies a first voltage to the horizontal readout circuit 30A. The second wiring supplies a second voltage that is different from the first voltage to the horizontal readout circuit 30A.

The horizontal readout circuit capacitor unit 30B has a capacitor. The capacitor is arranged in a region facing the horizontal readout circuit 30A in the first substrate 10 that is different from the second substrate 11 on which the horizontal readout circuit 30A is arranged (the first substrate 10 adjacent to the second substrate 11). The first terminal of the capacitor is electrically connected with the first wiring via the connection units 15. The second terminal of the capacitor is electrically connected with the second wiring via the connection units 15. That is, the capacitor is electrically connected with the first wiring and the second wiring via the connection units 15.

A peripheral constitution of the signal-processing circuit capacitor unit 60B and the signal-processing circuit 60A is the same as the constitution shown in FIG. 6. That is, first wiring and second wiring are provided to correspond to the signal-processing circuit 60A, and the signal-processing circuit 60A is connected with the first wiring and the second wiring. The first wiring supplies a first voltage to the signal-processing circuit 60A. The second wiring supplies a second voltage that is different from the first voltage to the signal-processing circuit 60A.

The signal-processing circuit capacitor unit 60B has a capacitor. The capacitor is arranged in a region facing the signal-processing circuit 60A in the first substrate 10 that is different from the second substrate 11 on which the signal-processing circuit 60A is arranged (the first substrate 10 adjacent to the second substrate 11). The first terminal of the capacitor is electrically connected with the first wiring via the connection units 15. The second terminal of the capacitor is electrically connected with the second wiring via the connection units 15. That is, the capacitor is electrically connected with the first wiring and the second wiring via the connection units 15.

A peripheral constitution of the output circuit capacitor unit 80B and the output circuit 80A is the same as the constitution shown in FIG. 6. That is, first wiring and second wiring are provided to correspond to the output circuit 80A, and the output circuit 80A is connected with the first wiring and the second wiring. The first wiring supplies a first voltage to the output circuit 80A. The second wiring supplies a second voltage that is different from the first voltage to the output circuit 80A.

The output circuit capacitor unit 80B has a capacitor. The capacitor is arranged in a region facing the output circuit 80A in the first substrate 10 that is different from the second substrate 11 on which the output circuit 80A is arranged (the first substrate 10 adjacent to the second substrate 11). The first terminal of the capacitor is electrically connected with the first wiring via the connection units 15. The second terminal of the capacitor is electrically connected with the second wiring via the connection units 15. That is, the capacitor is electrically connected with the first wiring and the second wiring via the connection units 15.

As described above, the first readout circuit capacitor unit 20B, the second readout circuit capacitor unit 21B, the horizontal readout circuit capacitor unit 30B, the signal-processing circuit capacitor unit 60B, and the output circuit capacitor unit 80B each have the capacitors. Capacitance values of these capacitors may be different values corresponding to the circuits arranged in the regions facing the capacitors.

Figure 7:
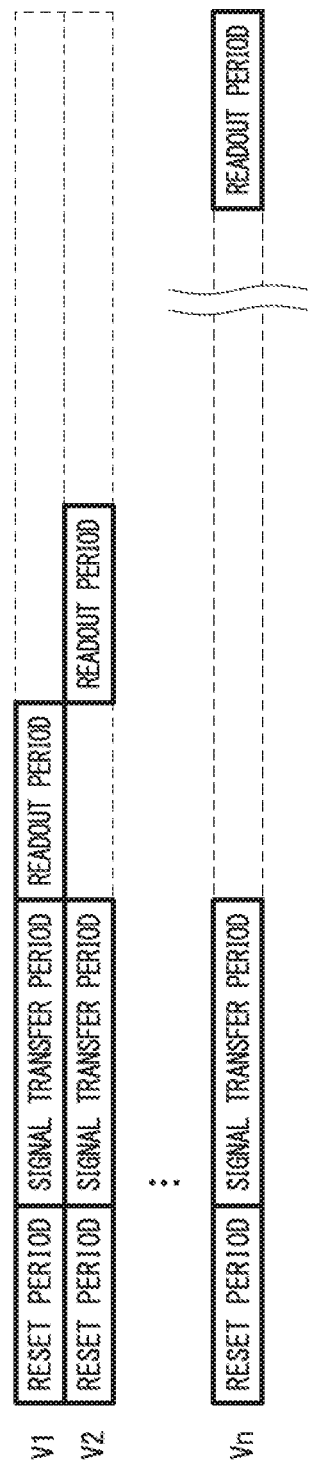
FIG. 7 is a timing chart showing an operation of the solid-state imaging device according to the first embodiment of the present invention.

FIG. 7 shows an operation of the solid-state imaging device 1. The vertical positions shown in FIG. 7 (V1, V2, . . . , and Vn) indicate vertical positions (row positions) of the array of the pixels 50, and the horizontal positions shown in FIG. 7 indicate time positions.

The operation of the solid-state imaging device 1 is constituted by operations of each of a reset period, a signal transfer period, and a readout period. The reset period is common for the pixels 50 of all the rows. In the reset period, the photoelectric conversion units 51A are simultaneously reset in the pixels 50 of all the rows, and then exposure starts.

Following the operation of the reset period, an operation of the signal transfer period is performed. The signal transfer period is common for the pixels 50 of all the rows. In the signal transfer period, signals from the photoelectric conversion units 51A are simultaneously read out in the pixels 50 of all the rows, and the signals are transferred to the memory units 52A. Thereby, the exposure ends. In the operation described above, simultaneity of exposure in all the pixels 50 can be realized.

Following the operation of the signal transfer period, an operation of the readout period is performed. A start timing and an end timing of the readout period differ in each row of the array of the pixels 50. In the readout period, signals from the memory units 52A are read out in the pixels 50 of each row.

Figure 8:
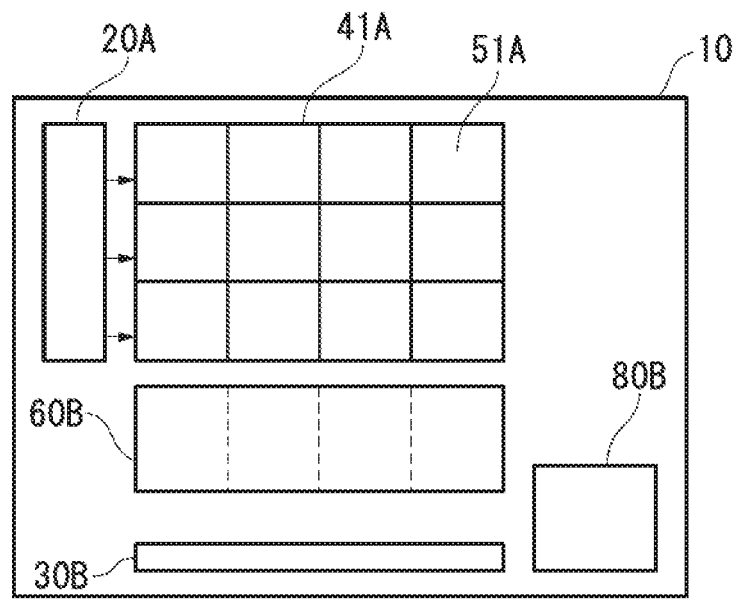
FIG. 8 is a block diagram showing a constitution example of a first substrate constituting a solid-state imaging device according to a modified example of the first embodiment of the present invention.

Next, a modified example of the present embodiment will be described. FIG. 8 shows a constitution example of a first substrate 10 according to the present modified example. As shown in FIG. 8, the first substrate 10 has a first readout circuit 20A, a horizontal readout circuit capacitor unit 30B, a pixel circuit 41A, a signal-processing circuit capacitor unit 60B, and an output circuit capacitor unit 80B. The second readout circuit capacitor unit 21B arranged on the first substrate 10 of FIG. 4 is not arranged on the first substrate 10 of FIG. 8. Since other constituent elements of the first substrate 10 of FIG. 8 are as described above, description thereof will be omitted.

Figure 9:
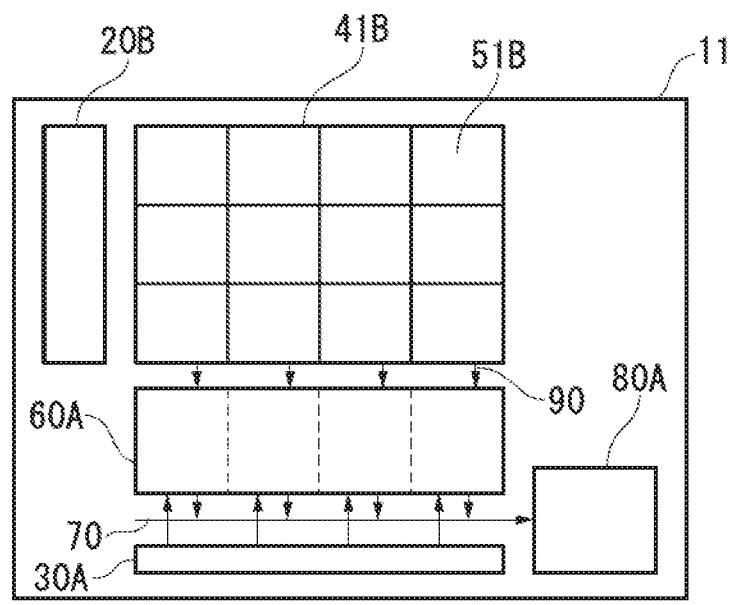
FIG. 9 is a block diagram showing a constitution example of a second substrate constituting the solid-state imaging device according to the modified example of the first embodiment of the present invention.

FIG. 9 shows a constitution example of a second substrate 11 according to the present modified example. As shown in FIG. 9, the second substrate 11 has a first readout circuit capacitor unit 20B, a horizontal readout circuit 30A, a pixel circuit capacitor unit 41B, a signal-processing circuit 60A, and an output circuit 80A. The second readout circuit 21A arranged on the second substrate 11 in FIG. 5 is not arranged on the second substrate 11 of FIG. 9. The pixel circuit capacitor unit 41B is arranged on the second substrate 11 of FIG. 9 in place of the memory circuit 42A arranged on the second substrate 11 of FIG. 5.

The pixel circuit capacitor unit 41B is a circuit arranged on the second substrate 11 among circuits constituting a pixel unit 40. The pixel circuit 41A arranged on the first substrate 10 and the pixel circuit capacitor unit 41B arranged on the second substrate 11 are arranged to face each other. The pixel circuit capacitor unit 41B has a plurality of photoelectric conversion capacitor units 51B. Although the plurality of photoelectric conversion capacitor units 51B are arranged in FIG. 9, one representative photoelectric conversion capacitor unit 51B is shown with a reference numeral. The plurality of photoelectric conversion capacitor units 51B are arranged in a matrix.

Signals read out from the pixel circuit 41A are transferred to the second substrate 11 via the connection units 15. The signals transferred to the second substrate 11 are output to the vertical signal lines 90 without being retained in the memory units.

A peripheral constitution of the photoelectric conversion units 51A and the photoelectric conversion capacitor units 51B is the same as the constitution shown in FIG. 6. That is, first wiring and second wiring are provided to correspond to the photoelectric conversion units 51A, and the photoelectric conversion units 51A are connected with the first wiring and the second wiring. The first wiring supplies a first voltage to the photoelectric conversion units 51A. The second wiring supplies a second voltage that is different from the first voltage to the photoelectric conversion units 51A.

The photoelectric conversion capacitor units 51B have capacitors. The capacitors are arranged in regions facing the photoelectric conversion units 51A in the second substrate 11 that is different from the first substrate 10 on which the photoelectric conversion units 51A are arranged (the second substrate 11 adjacent to the first substrate 10). The first terminals of the capacitors are electrically connected with the first wiring via the connection units 15. The second terminals of the capacitors are electrically connected with the second wiring via the connection units 15.

Figure 10:
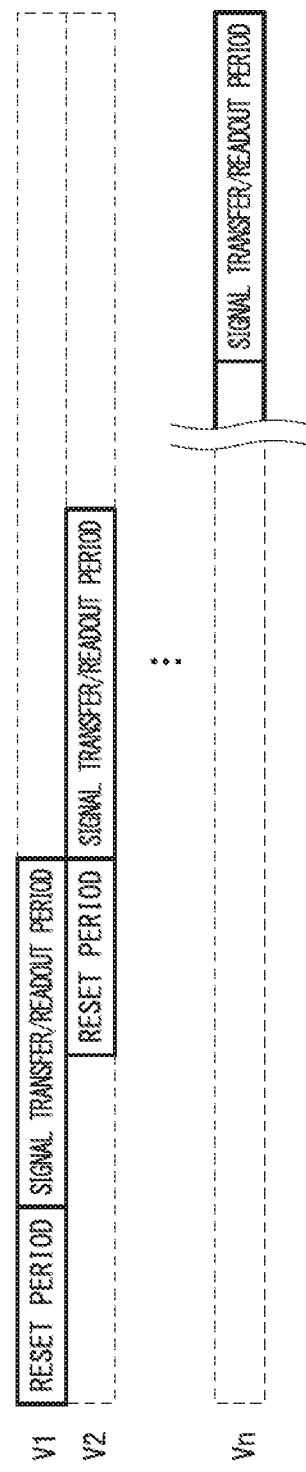
FIG. 10 is a timing chart showing an operation of the solid-state imaging device according to the modified example of the first embodiment of the present invention.

FIG. 10 shows an operation of the solid-state imaging device 1 according to the modified example. The vertical positions of FIG. 10 (V1, V2, . . . , and Vn) indicate vertical positions (row positions) in the array of the pixels 50, and the horizontal positions of FIG. 10 indicate time positions.

The operation of the solid-state imaging device 1 is constituted by operations of each of a reset period and a signal transfer period/readout period. The reset period and the signal transfer period/readout period are consecutive in the pixels 50 in each row. A start timing and an end timing of the reset period differ in each row of the array of the pixels 50. In addition, a start timing and an end timing of the signal transfer period/readout period differ in each row of the array of the pixels 50.

In the reset period, the photoelectric conversion units 51A are simultaneously reset in the pixels 50 in the same rows, and then exposure starts. Following the reset period, an operation of the signal transfer/readout period is performed. In the signal transfer/readout period, signals from the photoelectric conversion units 51A are simultaneously read out in the pixels 50 in the same rows, and the signals are transferred to the second substrate 11. In addition, in the signal transfer/readout period, the signals transferred to the second substrate 11 are output to the vertical signal lines 90.

Although the vertical signal lines 90 are arranged on the second substrate 11 in the modified example, the vertical signal lines 90 may be arranged on the first substrate 10. If the vertical signal lines 90 are arranged on the first substrate 10, signals are output from the photoelectric conversion units 51A to the vertical signal lines 90. The signals output to the vertical signal lines 90 are transferred to the second substrate 11 via the connection units 15. The signals transferred to the second substrate 11 are input to the signal-processing circuit 60A.

The solid-state imaging device to which the technology described in the present embodiment is applied may have at least one capacitor unit of the four capacitor units that are the first readout circuit capacitor unit 20B, the pixel circuit capacitor unit 41B, the signal-processing circuit capacitor unit 60B, and the output circuit capacitor unit 80B. The solid-state imaging device to which the technology described in the present embodiment is applied may have at least one of the second readout circuit capacitor unit 21B and the horizontal readout circuit capacitor unit 30B.

The second readout circuit capacitor unit 21B and the second readout circuit 21A are not essential constituent elements for the solid-state imaging device to which the technology described in the present embodiment is applied as shown in FIG. 8 and FIG. 9. In addition, noise can be reduced by at least any of the first readout circuit capacitor unit 20B, the pixel circuit capacitor unit 41B, the signal-processing circuit capacitor unit 60B, and the output circuit capacitor unit 80B, regardless of the horizontal readout circuit capacitor unit 30B and the horizontal readout circuit 30A. For this reason, the horizontal readout circuit capacitor unit 30B and the horizontal readout circuit 30A are not essential constituent elements for obtaining a characteristic effect of the solid-state imaging device according to the present embodiment.

If the solid-state imaging device to which the technology described in the present embodiment is applied has a first capacitor and a second capacitor, a capacitance value of the first capacitor may be greater than a capacitance value of the second capacitor. The first capacitor is electrically connected with first wiring and second wiring corresponding to the first readout circuit 20A. The second capacitor is electrically connected with first wiring and second wiring corresponding to the signal-processing circuit 60A or the output circuit 80A.

Alternatively, if the solid-state imaging device to which the technology described in the present embodiment is applied has a first capacitor, a second capacitor, and a third capacitor, a capacitance value of the first capacitor may be greater than a capacitance value of the second capacitor and a capacitance value of the third capacitor. The first capacitor is electrically connected with the first wiring and the second wiring corresponding to the first readout circuit 20A. The second capacitor is electrically connected with the first wiring and the second wiring corresponding to the signal-processing circuit 60A. The third capacitor is electrically connected with the first wiring and the second wiring corresponding to the output circuit 80A.

The operation of the solid-state imaging device shown in FIG. 7 includes a timing at which all the pixels 50 simultaneously operate. Thus, there is a case in which a consumption current of the first readout circuit 20A supplying a control signal to all the pixels 50 is higher than a consumption current of the signal-processing circuit 60A and a consumption current of the output circuit 80A. As a capacitance value of the first capacitor is set to be greater than a capacitance value of the second capacitor or a capacitance value of the first capacitor is set to be greater than a capacitance value of the second capacitor and a capacitance value of the second capacitor as described above, noise of an analog signal supplied to the first readout circuit 20A can be further reduced.

According to the present embodiment, the solid-state imaging device 1, in which a plurality of overlapping substrates (the first substrate 10 and the second substrate 11) are included and the plurality of substrates are electrically connected with each other by the connection units 15, is a solid-state imaging device that is provided with the pixel circuit 41A in which the photoelectric conversion units 51A that convert incident light into signals are arranged in a matrix, the first readout circuit 20A that read outs signals from the photoelectric conversion units 51A, the signal-processing circuit 60A that performs signal processing on signals read out from the photoelectric conversion units 51A, the output circuit 80A that outputs signals processed by the signal-processing circuit 60A to the outside, the first wiring L1 that is provided to correspond to each of the four circuits that are the pixel circuit 41A, the first readout circuit 20A, the signal-processing circuit 60A, and the output circuit 80A and supplies a first voltage to each of the circuits, the second wiring L2 that is provided to correspond to each of the four circuits and supplies a second voltage that is different from the first voltage to each of the circuits, and the capacitor C1 that is the capacitor C1 electrically connected with the first wiring L1 and the second wiring L2 corresponding to at least one of the four circuits, the first terminal of which is electrically connected with the first wiring L1 and the second terminal of which is electrically connected with the second wiring L2, and the capacitor C1 is arranged in a region facing a corresponding circuit in a substrate that is different from another substrate on which the corresponding circuit among the four circuits is arranged.

In the present embodiment, by arranging the capacitor C1 that is electrically connected with the first wiring and the second wiring corresponding to at least any circuit of the four circuits that are the pixel circuit 41A, the first readout circuit 20A, the signal-processing circuit 60A, and the output circuit 80A, noise caused by the influence of impedance of wiring can be reduced. Therefore, an erroneous operation of a circuit attributable to noise can be suppressed.

Second Embodiment

Next, the second embodiment of the present invention will be described. FIG. 1 to FIG. 5 and FIG. 7 to FIG. 10 also apply to the present embodiment. Since these diagrams have already been described, description thereof will be omitted.

Figure 11:
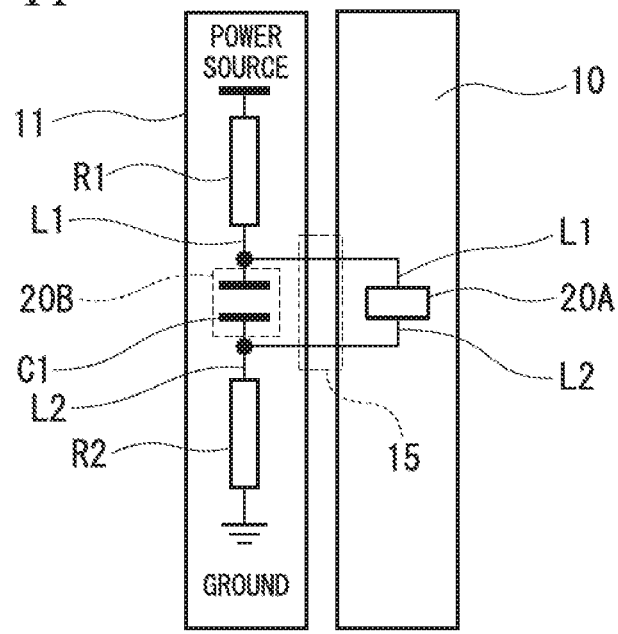
FIG. 11 is a circuit diagram showing a peripheral constitution example of a first readout circuit and a first readout circuit capacitor unit included in a solid-state imaging device according to a second embodiment of the present invention.

FIG. 11 shows a peripheral constitution example of a first readout circuit 20A and a first readout circuit capacitor unit 20B. First wiring L1 and second wiring L2 are provided to correspond to the first readout circuit 20A. The first readout circuit 20A is connected with the first wiring L1 and the second wiring L2.

In the present embodiment, the first wiring L1 is arranged across a first substrate 10 and a second substrate 11. Likewise, the second wiring L2 is arranged across the first substrate 10 and the second substrate 11 in the present embodiment.

The first wiring L1 is connected to a power source of the second substrate 11. The first wiring L1 supplies a power-source voltage that is a first voltage to the first readout circuit 20A. The first wiring L1 has a first impedance R1 caused by resistance, inductance, etc.

The second wiring L2 is connected to a ground in the second substrate 11. The second wiring L2 supplies a ground voltage (reference voltage) that is a second voltage different from the first voltage to the first readout circuit 20A. The second wiring L2 has a second impedance R2 caused by resistance, inductance, etc. The first voltage may be the ground voltage, and the second voltage may be the power-source voltage.

The first readout circuit capacitor unit 20B has a capacitor C1 that functions as a so-called bypass capacitor. The capacitor C1 is arranged in a region facing the first readout circuit 20A in the second substrate 11 that is different from the first substrate 10 on which the first readout circuit 20A is arranged (the second substrate 11 adjacent to the first substrate 10). The first terminal of the capacitor C1 is electrically connected with the first wiring L1. The second terminal of the capacitor C1 is electrically connected with the second wiring L2. That is, the capacitor C1 is electrically connected with the first wiring L1 and the second wiring L2.

A peripheral constitution of a second readout circuit capacitor unit 21B and a second readout circuit 21A is similar to the constitution shown in FIG. 11. A peripheral constitution of a horizontal readout circuit capacitor unit 30B and a horizontal readout circuit 30A is similar to the constitution shown in FIG. 11. A peripheral constitution of a pixel circuit 41A and a pixel circuit capacitor unit 41B is similar to the constitution shown in FIG. 11. A peripheral constitution of a signal-processing circuit capacitor unit 60B and a signal-processing circuit 60A is similar to the constitution shown in FIG. 11. A peripheral constitution of an output circuit capacitor unit 80B and an output circuit 80A is similar to the constitution shown in FIG. 11.

In the solid-state imaging device to which the technology described in the present embodiment is applied, the first wiring that supplies the first voltage and the second wiring that supplies the second voltage are arranged across the same substrate as the substrate on which the first readout circuit and the like are arranged and the substrate adjacent to the foregoing substrate. Capacitors corresponding to respective circuits may be electrically connected with first wiring and second wiring in the adjacent substrates without passing through a connection unit.

In the present embodiment, a current supplied from the power source passes through the first wiring L1, flows to the capacitor C1 of the first readout circuit capacitor unit 20B, and is supplied to the first readout circuit 20A. Both a voltage change of the power supply and a current change caused by switching of the first readout circuit 20A are compensated for by the capacitor C1. In this manner, the power source and the first readout circuit 20A can be efficiently separated by the capacitor C1. Thus, noise caused by influence of impedance of wiring can be reduced more than in the first embodiment. Thereby, an erroneous operation attributable to noise can be further suppressed.

Third Embodiment

Next, the third embodiment of the present invention will be described. FIG. 1 to FIG. 5 and FIG. 7 to FIG. 10 also apply to the present embodiment. Since these diagrams have already been described, description thereof will be omitted.

Figure 12:
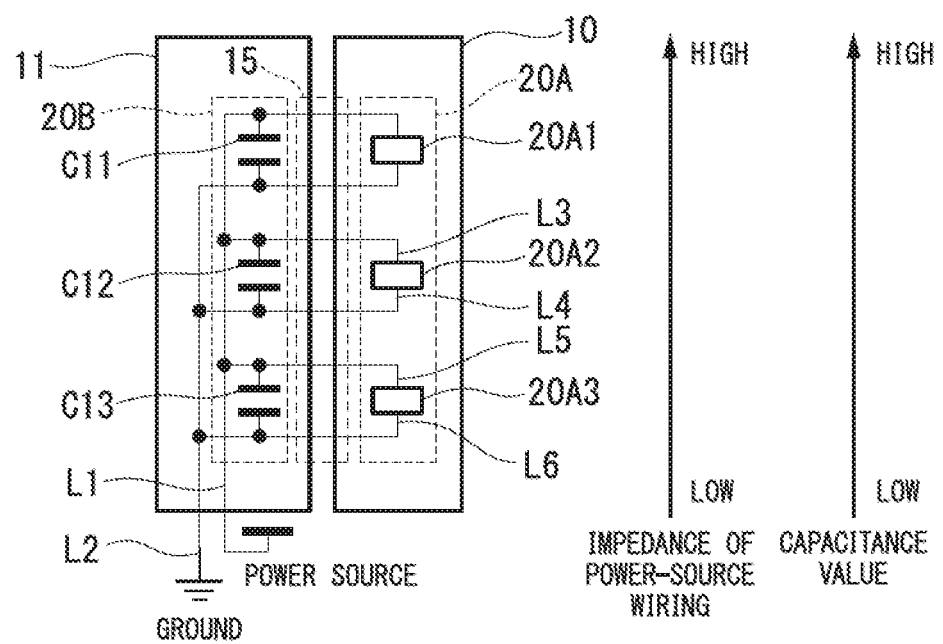
FIG. 12 is a circuit diagram showing a peripheral constitution example of a first readout circuit and a first readout circuit capacitor unit included in a solid-state imaging device according to a third embodiment of the present invention.

FIG. 12 shows a peripheral constitution example of a first readout circuit 20A and a first readout circuit capacitor unit 20B. The first readout circuit 20A has a first row readout circuit 20A1, a second row readout circuit 20A2, and a third row readout circuit 20A3. The first row readout circuit 20A1 reads signals from photoelectric conversion units 51A of the first row in the array of the photoelectric conversion units 51A. The second row readout circuit 20A2 reads out signals from photoelectric conversion units 51A of the second row that is different from the first row in the array of the photoelectric conversion units 51A. The third row readout circuit 20A3 reads out signals from photoelectric conversion units 51A of the third row that is different from the first row and the second row in the array of the photoelectric conversion units 51A.

First wiring L1 and second wiring L2 are provided to correspond to the first row readout circuit 20A1. The first wiring L1 is arranged across both a first substrate 10 and a second substrate 11. Likewise, the second wiring L2 is arranged across both the first substrate 10 and the second substrate 11. The first row readout circuit 20A1 is connected with the first wiring L1 and the second wiring L2. The first wiring L1 is connected to a power source. The first wiring L1 supplies a power-source voltage that is a first voltage to the first row readout circuit 20A1. The second wiring L2 is connected to a ground. The second wiring L2 supplies a ground voltage (reference voltage) that is a second voltage different from the first voltage to the first row readout circuit 20A1. The first voltage may be the ground voltage, and the second voltage may be a power-source voltage, etc.

Third wiring L3 and fourth wiring L4 are provided to correspond to the second row readout circuit 20A2. The third wiring L3 is arranged across both the first substrate 10 and the second substrate 11. Likewise, the fourth wiring L4 is arranged across both the first substrate 10 and the second substrate 11. The second row readout circuit 20A2 is connected with the third wiring L3 and the fourth wiring L4. The third wiring L3 is connected with the first wiring L1. That is, the third wiring L3 is connected to the power source via the first wiring L1. The third wiring L3 supplies the power-source voltage to the second row readout circuit 20A2. The fourth wiring L4 is connected with the second wiring L2. That is, the fourth wiring L4 is connected to the ground via the second wiring L2. The fourth wiring L4 supplies the ground voltage to the second row readout circuit 20A2.

Fifth wiring L5 and sixth wiring L6 are provided to correspond to the third row readout circuit 20A3. The fifth wiring L5 is arranged across both the first substrate 10 and the second substrate 11. Likewise, the sixth wiring L6 is arranged across both the first substrate 10 and the second substrate 11. The third row readout circuit 20A3 is connected with the fifth wiring L5 and the sixth wiring L6. The fifth wiring L5 is connected with the first wiring L1. That is, the fifth wiring L5 is connected to the power source via the first wiring L1. The fifth wiring L5 supplies the power-source voltage to the third row readout circuit 20A3. The sixth wiring L6 is connected with the second wiring L2. That is, the sixth wiring L6 is connected to the ground via the second wiring L2. The sixth wiring L6 supplies the ground voltage to the third row readout circuit 20A3.

The first readout circuit capacitor unit 20B has a first capacitor C11, a second capacitor C12, and a third capacitor C13 that function as so-called bypass capacitors. The first capacitor C11, the second capacitor C12, and the third capacitor C13 are arranged in regions facing the first readout circuit 20A in the second substrate 11 that is different from the first substrate 10 on which the first readout circuit 20A is arranged (the second substrate 11 adjacent to the first substrate 10). The first capacitor C11 is arranged to face the first row readout circuit 20A1, the second capacitor C12 is arranged to face the second row readout circuit 20A2, and the third capacitor C13 is arranged to face the third row readout circuit 20A3.

The first terminal of the first capacitor C11 is electrically connected with the first wiring L1. The second terminal of the first capacitor C11 is electrically connected with the second wiring L2. That is, the first capacitor C11 is electrically connected with the first wiring L1 and the second wiring L2.

The first terminal of the second capacitor C12 is electrically connected with the third wiring L3. The second terminal of the second capacitor C12 is electrically connected with the fourth wiring L4. That is, the second capacitor C12 is electrically connected with the third wiring L3 and the fourth wiring L4.

The first terminal of the third capacitor C13 is electrically connected with the fifth wiring L5. The second terminal of the third capacitor C13 is electrically connected with the sixth wiring L6. That is, the third capacitor C13 is electrically connected with the fifth wiring L5 and the sixth wiring L6.

As described above, the first readout circuit 20A is divided into three row readout circuits. The first readout circuit 20A may be divided into a plurality of row readout circuits, without being limited to the above example. The first readout circuit 20A is divided in units according to driving timings of photoelectric conversion units 51A. Since the photoelectric conversion units 51A are driven in units of rows in the present embodiment, the first readout circuit 20A is divided in units of rows.

Due to the above constitution, noise occurring during driving of a certain row readout circuit is reduced by the capacitor corresponding to the row readout circuit. Thus, it is possible to suppress noise from propagating to another row readout circuit. That is, an erroneous operation attributable to propagation of noise between a plurality of row readout circuits constituting the first readout circuit 20A can be suppressed.

A capacitance value of the first capacitor C1 may be a capacitance value according to the length of the wiring from the power source to the first row readout circuit 20A1. A capacitance value of the second capacitor C12 may be a capacitance value according to the length of the wiring from the power source to the second row readout circuit 20A2. A capacitance value of the third capacitor C13 may be a capacitance value according to the length of the wiring from the power source to the third row readout circuit 20A3. That is, capacitance values of the first capacitor C11, the second capacitor C12, and the third capacitor C13 may be capacitance values according to the distances from the voltage source supplying the first voltage.

As a distance from the power source increases, impedance of wiring increases, and thus noise easily increases. Therefore, for example, by setting a capacitance value of a capacitor to become higher as a distance from the power source increases, noise can be further reduced.

A capacitance value of the first capacitor C1 may be a capacitance value according to the length of the wiring from the ground to the first row readout circuit 20A1. A capacitance value of the second capacitor C12 may be a capacitance value according to the length of the wiring from the ground the second row readout circuit 20A2. A capacitance value of the third capacitor C13 may be a capacitance value according to the length of the wiring from the ground to the third row readout circuit 20A3. That is, capacitance values of the first capacitor C11, the second capacitor C12, and the third capacitor C13 may be capacitance values according to distances from the voltage sources supplying the second voltage.

In the constitution example shown in FIG. 12, the length of the wiring from the power source to each row readout circuit is substantially the same as the length of the wiring from the ground to each row readout circuit. Thus, in the constitution example shown in FIG. 12, as a distance from the ground increases, a distance from the power source increases, and noise caused by impedance of the wiring easily increases. Therefore, by setting a capacitance value of a capacitor to be higher as a distance from the ground increases, for example, noise can be further reduced.

Figure 13:
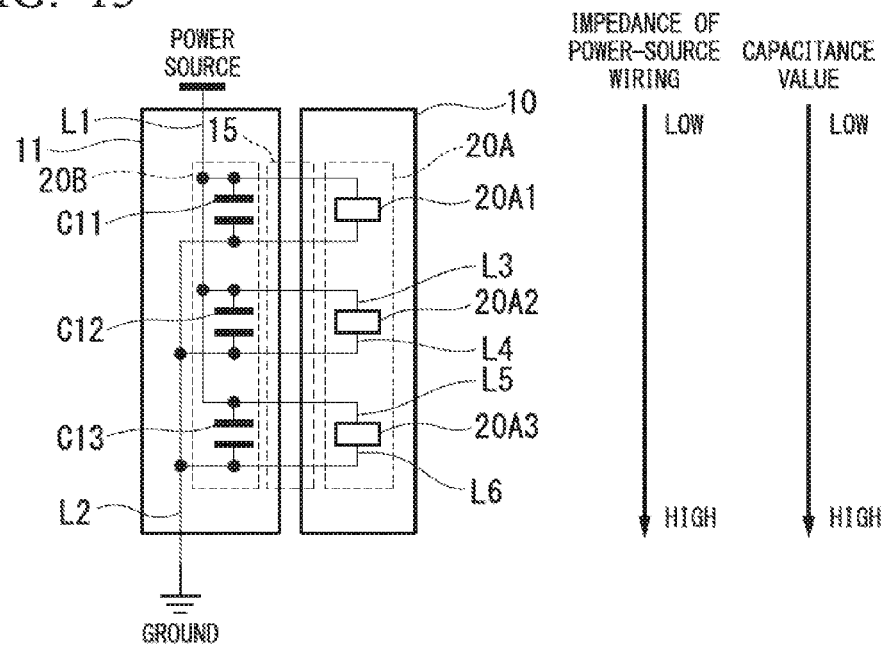
FIG. 13 is a circuit diagram showing another peripheral constitution example of the first readout circuit and the first readout circuit capacitor unit included in the solid-state imaging device according to the third embodiment of the present invention.

FIG. 13 shows another peripheral constitution example of the first readout circuit 20A and the first readout circuit capacitor unit 20B. The first readout circuit 20A has the first row readout circuit 20A 1, the second row readout circuit 20A2, and the third row readout circuit 20A3. Since these row readout circuits have already been described, description thereof will be omitted.

As in FIG. 12, the first wiring L1 and the second wiring L2 are provided to correspond to the first row readout circuit 20A1, the third wiring L3 and the fourth wiring L4 are provided to correspond to the second row readout circuit 20A2, and the fifth wiring L5 and the sixth wiring L6 are provided to correspond to the third row readout circuit 20A3. These wiring connection relationship are the same as the wiring connection relationship of FIG. 12.

The first readout circuit capacitor unit 20B has the first capacitor C11, the second capacitor C12, and the third capacitor C13. Since these capacitors have already been described, description thereof will be omitted.

In the constitution shown in FIG. 13, the length of the wiring from the power source to each row readout circuit is different from the length of the wiring from the ground to each row readout circuit. In this case, a capacitance value of each capacitor may be decided in consideration of driving of a circuit. For example, when the first row readout circuit 20A1, the second row readout circuit 20A2, and the third row readout circuit 20A3 include circuits that output pulses and reduction of a delay in a rise of a signal is prioritized over reduction of a delay in a fall of a signal, a capacitance value of a capacitor is decided such that the capacitance value of the capacitor increases as a distance from a power source increases.

A signal-processing circuit 60A is divided into a plurality of signal-processing circuits, like the first readout circuit 20A. For example, the signal-processing circuit 60A has a plurality of column signal-processing circuits including a first column signal-processing circuit and a second column signal-processing circuit. The first column signal-processing circuit performs signal processing on signals read out from the photoelectric conversion units 51A in a first column in the array of the photoelectric conversion units 51A. The second column signal-processing circuit performs signal processing on signals read out from the photoelectric conversion units 51A in a second column that is different from the first column in the array of the photoelectric conversion units 51A.

A signal-processing circuit capacitor unit 60B, for example, includes a first capacitor and a second capacitor, and has a plurality of capacitors corresponding to the respective column signal-processing circuits. The first capacitor is a capacitor that is electrically connected with first wiring and second wiring corresponding to the first column signal-processing circuit, the first terminal thereof is electrically connected with the first wiring, and the second terminal is electrically connected with the second wiring. The second capacitor is a capacitor that is electrically connected with first wiring and second wiring corresponding to the second column signal-processing circuit, the first terminal thereof is electrically connected with the first wiring, and the second terminal is electrically connected with the second wiring.

The signal-processing circuit 60A is divided in units according to signals to be processed. In the present embodiment, since signals that are simultaneously read out from the photoelectric conversion units 51A of one row are processed in units of columns, the signal-processing circuit 60A is divided into column units.

A capacitance value of the first capacitor and a capacitance value of the second capacitor are capacitance values according to a distance from a voltage source supplying the first voltage (for example, the power source supplying a predetermined voltage). In addition, a capacitance value of the first capacitor and a capacitance value of the second capacitor may be capacitance values according to a distance from a voltage source supplying the second voltage (for example, the ground supplying the ground voltage).

The signal-processing circuit 60A may be divided in units different from the above which are units according to signals to be processed. Another example in which the signal-processing circuit 60A is divided will be described below.

Figure 14:
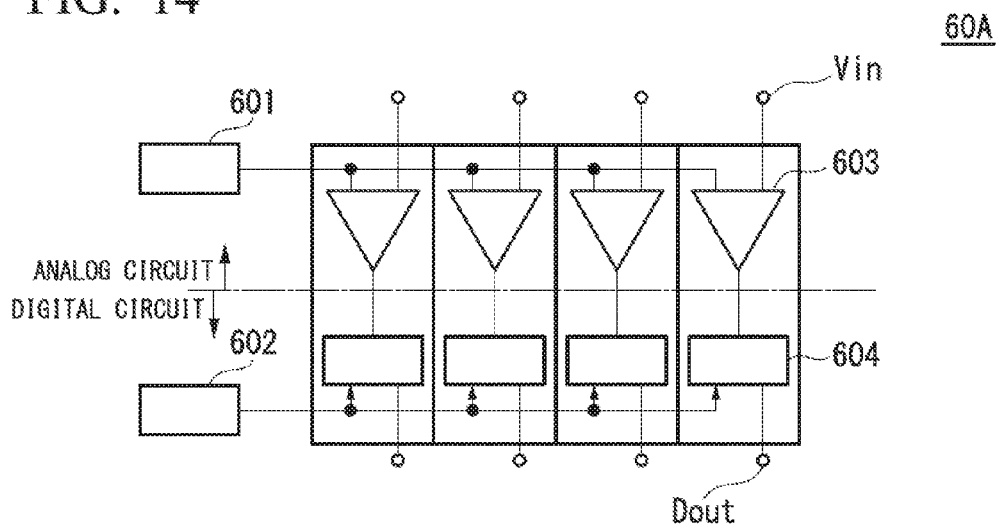
FIG. 14 is a block diagram showing a constitution example of a signal-processing circuit included in the solid-state imaging device according to the third embodiment of the present invention.

FIG. 14 shows a constitution example of the signal-processing circuit 60A. As shown in FIG. 14, the signal-processing circuit 60A has a ramp wave generation circuit 601, a clock generation circuit 602, comparators 603, and counters 604.

The ramp wave generation circuit 601 generates ramp waves in which a voltage rises or falls at a substantially constant temporal rate. The clock generation circuit 602 generates a clock of a predetermined frequency. The comparators 603 compare the voltage of an input signal Vin and the voltage of a ramp wave generated by the ramp wave generation circuit 601, and when a magnitude relation of these voltages is switched, they invert the output. Although a plurality of comparators 603 are arranged in FIG. 14, one representative comparator 603 is shown with a reference numeral. The counters 604 count clocks generated by the clock generation circuit 602 and stop counting at a timing at which an output of the comparators 603 is inverted. Although a plurality of counters 604 are arranged in FIG. 14, one representative counter 604 is shown with a reference numeral.

The input signal Vin input to the comparators 603 is a signal output from pixels 50. A count value at the time at which the counters 604 stop counting is output as a digital signal Dout based on the input signal Vin that is an analog signal.

The signal-processing circuit 60A is divided into analog circuits and digital circuits. That is, the signal-processing circuit 60A is divided into the ramp wave generation circuit 601 and the comparators 603 that are the analog circuits and the clock generation circuit 602 and the counters 604 that are digital circuits. The signal-processing circuit capacitor unit 60B has, for example, a first capacitor for the analog circuits and a second capacitor for the digital circuits. The first capacitor for the analog circuits may be divided into a capacitor corresponding to the ramp wave generation circuit 601 and a capacitor corresponding to the comparators 603. In addition, the second capacitor for the digital circuits may be divided into a capacitor corresponding to the clock generation circuit 602 and a capacitor corresponding to the counters 604.

A second readout circuit 21A may be divided into plural ones like the plurality of first readout circuits 20A. For example, the second readout circuit 21A may have a first row readout circuit, a second row readout circuit, and a third row readout circuit. The first row readout circuit reads signals retained in memory units 52A in the first row in the array of the memory units 52A, and causes the read out signals to be input to the signal-processing circuit 60A. The second row readout circuit reads out signals retained in memory units 52A in the second row that is different from the first row in the array of the memory units 52A, and causes the read out signals to be input to the signal-processing circuit 60A. The third row readout circuit reads out signals retained in memory units 52A in the third row that is different from the first row and the second row in the array of the memory units 52A, and causes the read out signals to be input to the signal-processing circuit 60A.

A peripheral constitution of the second readout circuit 21A and a second readout circuit capacitor unit 21B may be similar to the constitution shown in FIG. 12 or FIG. 13.

In the present embodiment, circuits are divided into a plurality of units relating to driving of the circuits and a plurality of capacitors are arranged to correspond to the plurality of divided circuits, and thereby an erroneous operation caused by propagation of noise between the plurality of divided circuits can be suppressed.

In addition, by setting capacitance values of the plurality of capacitors corresponding to the plurality of divided circuits to be capacitance values according to distances from a voltage source supplying the first voltage or the second voltage, noise can be further reduced.

Fourth Embodiment

Next, the fourth embodiment of the present invention will be described. FIG. 1, FIG. 2, and FIG. 10 also apply to the present embodiment. Since these diagrams have already been described, description thereof will be omitted. However, in the present embodiment, a solid-state imaging device 1 has three substrates (a first substrate 10, a second substrate 11, and a third substrate 12). Any two adjacent substrates are electrically connected by connection units 15.

Figure 15:
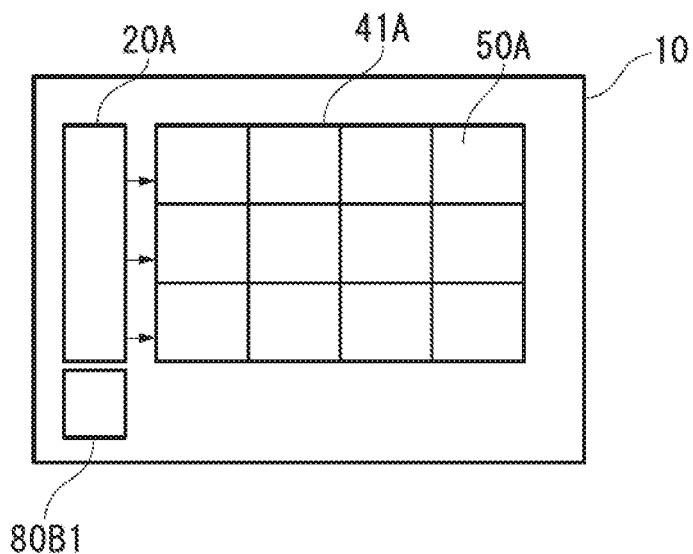
FIG. 15 is a block diagram showing a constitution example of a first substrate constituting a solid-state imaging device according to a fourth embodiment of the present invention.

FIG. 15 shows a constitution example of the first substrate 10. As shown in FIG. 15, the first substrate 10 has a first readout circuit 20A, a pixel circuit 41A, and a first output circuit capacitor unit 80B1.

Since the first readout circuit 20A and the pixel circuit 41A have already been described, description thereof will be omitted. The first output circuit capacitor unit 80B 1 is a circuit arranged on the first substrate 10 among circuits constituting an output unit 80. The first output circuit capacitor unit 80B 1 has a capacitor for reducing noise, like the output circuit capacitor unit 80B of FIG. 4.

Figure 16:
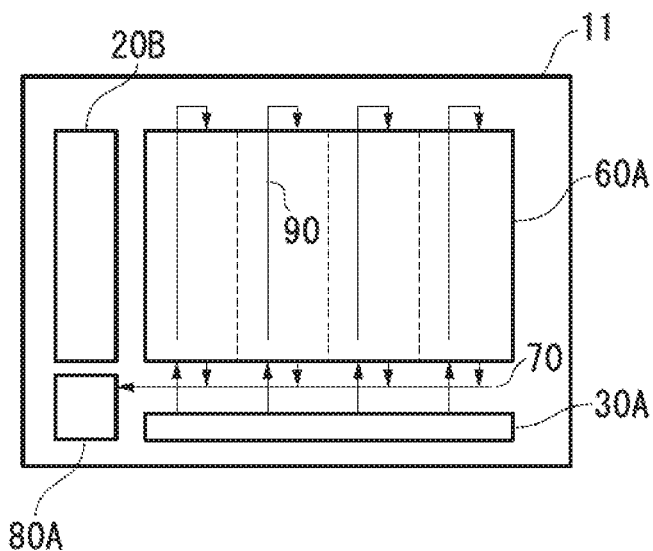
FIG. 16 is a block diagram showing a constitution example of a second substrate constituting the solid-state imaging device according to the fourth embodiment of the present invention.

FIG. 16 shows a constitution example of the second substrate 11. As shown in FIG. 16, the second substrate 11 has a first readout circuit capacitor unit 20B, a horizontal readout circuit 30A, a signal-processing circuit 60A, and an output circuit 80A. Since the first readout circuit capacitor unit 20B, the horizontal readout circuit 30A, and the output circuit 80A have already been described, description thereof will be omitted.

The signal-processing circuit 60A is arranged in a region facing the pixel circuit 41A in the second substrate 11. Vertical signal lines 90 are arranged inside the signal-processing circuit 60A. In addition, the vertical signal lines 90 are connected to input terminals of respective column signal-processing circuits of the signal-processing circuit 60A. Signals read out from the pixel circuit 41A are transferred to the second substrate 11 via the connection units 15. The signals transferred to the second substrate 11 are input to the signal-processing circuit 60A via the vertical signal lines 90.

Figure 17:
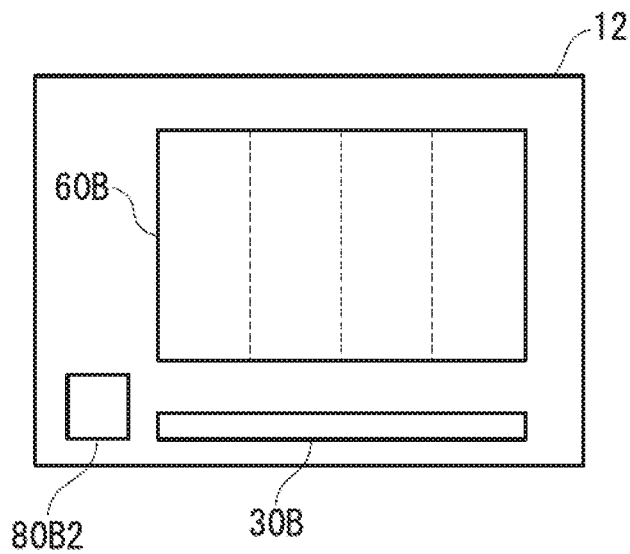
FIG. 17 is a block diagram showing a constitution example of a third substrate constituting the solid-state imaging device according to the fourth embodiment of the present invention.

FIG. 17 shows a constitution example of the third substrate 12. As shown in FIG. 17, the third substrate 12 has a horizontal readout circuit capacitor unit 30B, a signal-processing circuit capacitor unit 60B, and a second output circuit capacitor unit 80B2. Since the horizontal readout circuit capacitor unit 30B has already been described, description thereof will be omitted.

The signal-processing circuit capacitor unit 60B is arranged in a region facing the signal-processing circuit 60A in the third substrate 12. In other words, when it is not possible to arrange the signal-processing circuit capacitor unit 60B in a region facing the signal-processing circuit 60A in the first substrate 10, the signal-processing circuit capacitor unit 60B is arranged in a region facing the signal-processing circuit 60A in the third substrate 12. In this case, the first substrate 10 is one substrate adjacent to the second substrate 11 on which the signal-processing circuit 60A is arranged and the third substrate 12 is the other substrate adjacent to the second substrate 11.

The second output circuit capacitor unit 80B2 is a circuit arranged on the third substrate 12 among the circuits constituting the output unit 80. The second output circuit capacitor unit 80B2 has a capacitor for reducing noise, like the output circuit capacitor unit 80B of FIG. 4.

In the present embodiment, the first output circuit capacitor unit 80B1 and the second output circuit capacitor unit 80B2 are arranged to correspond to the output circuit 80A that causes a large amount of consumption current. The first output circuit capacitor unit 80B1 is arranged in a region facing the output circuit 80A in the first substrate 10. In addition, the second output circuit capacitor unit 80B2 is arranged in a region facing the output circuit 80A in the third substrate 12.

In the present embodiment, the third substrate 12 is added to the solid-state imaging device 1, and capacitor units corresponding to respective circuits arranged on the second substrate 11 are arranged on the third substrate 12. Thus, even when circuits using active elements (the pixel circuit 41A and the signal-processing circuit 60A) are arranged in respective regions facing the first substrate 10 and the second substrate 11, capacitor units can be arranged on the third substrate 12.

Fifth Embodiment

Next, the fifth embodiment of the present invention will be described. FIG. 1 to FIG. 3 and FIG. 10 also apply to the present embodiment. Since these diagrams have already been described, description thereof will be omitted.

Figure 18:
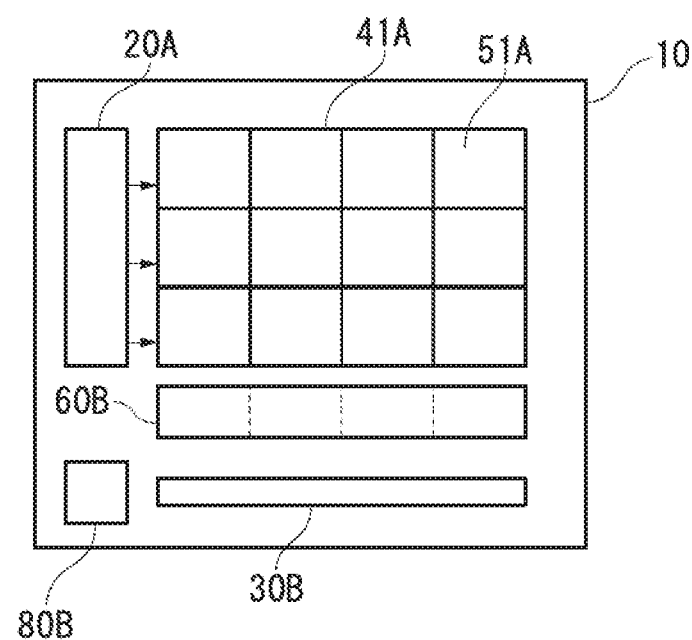
FIG. 18 is a block diagram showing a constitution example of a first substrate constituting a solid-state imaging device according to a fifth embodiment of the present invention.

FIG. 18 shows a constitution example of a first substrate 10. As shown in FIG. 18, the first substrate 10 has a first readout circuit 20A, a horizontal readout circuit capacitor unit 30B, a pixel circuit 41A, a signal-processing circuit capacitor unit 60B, and an output circuit capacitor unit 80B.

Since the first readout circuit 20A and the pixel circuit 41A have already been described, description thereof will be omitted. In the present embodiment, the horizontal readout circuit capacitor unit 30B and the signal-processing circuit capacitor unit 60B that are arranged on the third substrate 12 in the fourth embodiment are arranged on the first substrate 10. In addition, the output circuit capacitor unit 80B that is formed by combining the first output circuit capacitor unit 80B1 arranged on the first substrate 10 and the second output circuit capacitor unit 80B2 arranged on the third substrate 12 in the fourth embodiment is arranged on the first substrate 10.

Figure 19:
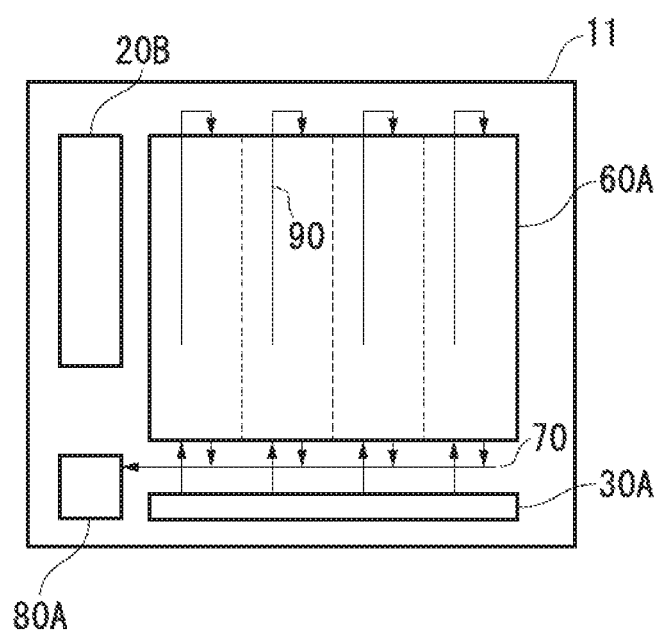
FIG. 19 is a block diagram showing a constitution example of a second substrate constituting the solid-state imaging device according to the fifth embodiment of the present invention.

FIG. 19 shows a constitution example of a second substrate 11. As shown in FIG. 19, the second substrate 11 has a first readout circuit capacitor unit 20B, a horizontal readout circuit 30A, a signal-processing circuit 60A, and an output circuit 80A. Since the first readout circuit capacitor unit 20B, the horizontal readout circuit 30A, and the output circuit 80A have already been described, description thereof will be omitted.

The signal-processing circuit 60A is arranged over a region facing the pixel circuit 41A and a region positioned below the region in the second substrate 11. The signal-processing circuit 60A is similar to the signal-processing circuit 60A of FIG. 16, except for the regions in which the former signal-processing circuit 60A is arranged.

The signal-processing circuit capacitor unit 60B is arranged in a part of the region facing the signal-processing circuit 60A (a region of the region facing the signal-processing circuit 60A excluding the region in which the pixel circuit 41A is arranged) in the first substrate 10. In addition, the signal-processing circuit capacitor unit 60B is arranged in a region between the pixel circuit 41A and the horizontal readout circuit capacitor unit 30B.

In the present embodiment, circuits (the pixel circuit 41A and the signal-processing circuit 60A) using active elements are arranged in regions of the first substrate 10 and the second substrate 11 facing each other. It is possible even in such a case to reduce noise by arranging capacitor units in a part of regions facing the circuits corresponding to the capacitor units, without increasing the number of substrates.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A solid-state imaging device in which a plurality of overlapping substrates are included and the plurality of substrates are electrically connected to each other by a connection unit, comprising:
    a pixel circuit in which photoelectric conversion units that convert incident light into signals are arranged in a matrix;
    a first readout circuit configured to read out signals from the photoelectric conversion units;
    a signal-processing circuit configured to perform signal processing on signals read out from the photoelectric conversion units;
    an output circuit configured to output signals processed by the signal-processing circuit to the outside;
    a first wiring configured to be provided to correspond to each of the four circuits that are the pixel circuit, the first readout circuit, the signal-processing circuit, and the output circuit and to supply a first voltage to each of the four circuits;
    a second wiring configured to be provided to correspond to each of the four circuits and to supply a second voltage that is different from the first voltage to each of the four circuits; and
    a capacitor that is electrically connected with the first wiring and the second wiring corresponding to at least one of the four circuits, the first terminal of which is electrically connected with the first wiring and the second terminal of which is electrically connected with the second wiring,
    wherein the capacitor is arranged in a region facing a corresponding circuit in a substrate that is different from another substrate on which the corresponding circuit among the four circuits is arranged.

2. The solid-state imaging device according to claim 1, wherein the capacitor is electrically connected with the first wiring and the second wiring via the connection unit.

3. The solid-state imaging device according to claim 1, wherein the first wiring and the second wiring are arranged across the substrate on which the corresponding circuit among the four circuits is arranged and a substrate adjacent to the substrate, and
    the capacitor is electrically connected with the first wiring and the second wiring on the adjacent substrate.

4. The solid-state imaging device according to claim 1, wherein the capacitor has a first capacitor that is electrically connected with the first wiring and the second wiring corresponding to the first readout circuit, and a second capacitor that is electrically connected with the first wiring and the second wiring corresponding to the signal-processing circuit or the output circuit, and
    wherein a capacitance value of the first capacitor is higher than a capacitance value of the second capacitor.

5. The solid-state imaging device according to claim 1, wherein the capacitor has a first capacitor that is electrically connected with the first wiring and the second wiring corresponding to the first readout circuit, a second capacitor that is electrically connected with the first wiring and the second wiring corresponding to the signal-processing circuit, and a third capacitor that is electrically connected with the first wiring and the second wiring corresponding to the output circuit, and wherein a capacitance value of the first capacitor is higher than a capacitance value of the second capacitor and a capacitance value of the third capacitor.

6. The solid-state imaging device according to claim 1, comprising:
a memory unit configured to retain signals read out from the photoelectric conversion units;
a second readout circuit configured to read out signals retained in the memory unit and to cause the read out signals to be input to the signal-processing circuit;
a third wiring configured to supply the first voltage to the second readout circuit;
a fourth wiring configured to supply the second voltage to the second readout circuit; and
a second readout circuit capacitor, the first terminal of which is connected with the third wiring and the second terminal of which is connected with the fourth wiring.

7. The solid-state imaging device according to claim 1, wherein the first readout circuit has a first row readout circuit configured to read out signals from the photoelectric conversion units of a first row, and a second row readout circuit configured to read out signals from the photoelectric conversion units of a second row that is different from the first row,
wherein the first wiring and the second wiring are provided to correspond respectively to the first row readout circuit and the second row readout circuit, and
wherein the capacitor has a first capacitor that is electrically connected with the first wiring and the second wiring corresponding to the first row readout circuit, the first terminal of which is electrically connected with the first wiring and the second terminal of which is electrically connected with the second wiring, and a second capacitor that is electrically connected with the first wiring and the second wiring corresponding to the second row readout circuit, the first terminal of which is electrically connected with the first wiring and the second terminal of which is electrically connected with the second wiring.

8. The solid-state imaging device according to claim 1, wherein the signal-processing circuit has a first column signal-processing circuit configured to perform signal processing on signals read out from the photoelectric conversion units of a first column and a second column signal-processing circuit configured to perform signal processing on signals read out from the photoelectric conversion units of a second column that is different from the first column,
wherein the first wiring and the second wiring are provided to correspond to each of the first column signal-processing circuit and the second column signal-processing circuit, and
wherein the capacitor has a first capacitor that is electrically connected with the first wiring and the second wiring corresponding to the first column signal-processing circuit, the first terminal of which is electrically connected with the first wiring and the second terminal of which is electrically connected with the second wiring, and a second capacitor that is electrically connected with the first wiring and the second wiring corresponding to the second column signal-processing circuit, the first terminal of which is electrically connected with the first wiring and the second terminal of which is electrically connected with the second wiring.

9. The solid-state imaging device according to claim 7, wherein a capacitance value of the first capacitor and a capacitance value of the second capacitor are capacitance values according to a distance from a voltage source supplying the first voltage.

10. The solid-state imaging device according to claim 8, wherein a capacitance value of the first capacitor and a capacitance value of the second capacitor are capacitance values according to a distance from a voltage source supplying the first voltage.

11. The solid-state imaging device according to claim 7, wherein a capacitance value of the first capacitor and a capacitance value of the second capacitor are capacitance values according to a distance from a voltage source supplying the second voltage.

12. The solid-state imaging device according to claim 8, wherein a capacitance value of the first capacitor and a capacitance value of the second capacitor are capacitance values according to a distance from a voltage source supplying the second voltage.

13. An imaging apparatus comprising the solid-state imaging device according to claim 1.

* * * * *